(12) United States Patent
Mei et al.

(10) Patent No.: US 9,455,221 B2
(45) Date of Patent: Sep. 27, 2016

(54) PREPARATION METHOD OF THREE-DIMENSIONAL INTEGRATED INDUCTOR-CAPACITOR STRUCTURE

(71) Applicant: Wuhan Xinxin Semiconductor Manufacturing Co., Ltd., Wuhan, Hubei (CN)

(72) Inventors: Shaoning Mei, Hubei (CN); Shaofu Ju, Hubei (CN); Jifeng Zhu, Hubei (CN)

(73) Assignee: WUHAN XINXIN SEMICONDUCTOR MANUFACTURING CO., LTD., Wuhan, Hubei (CN)

(*) Notice: Subject to any disclaimer, the term of this patent is extended or adjusted under 35 U.S.C. 154(b) by 0 days.

(21) Appl. No.: 14/811,875

(22) Filed: Jul. 29, 2015

(65) Prior Publication Data
US 2016/0079165 A1     Mar. 17, 2016

(30) Foreign Application Priority Data

Sep. 15, 2014   (CN) .......................... 2014 1 0469021

(51) Int. Cl.
| | |
|---|---|
| H01L 23/522 | (2006.01) |
| H01L 49/02 | (2006.01) |
| H01L 21/768 | (2006.01) |
| H01L 21/3213 | (2006.01) |
| H01L 23/532 | (2006.01) |
| H01L 21/321 | (2006.01) |

(52) U.S. Cl.
CPC ....... *H01L 23/5227* (2013.01); *H01L 21/3212* (2013.01); *H01L 21/32133* (2013.01); *H01L 21/76802* (2013.01); *H01L 21/76877* (2013.01); *H01L 23/5223* (2013.01); *H01L 23/53209* (2013.01); *H01L 23/53257* (2013.01); *H01L 28/10* (2013.01); *H01L 28/40* (2013.01); *H01L 2924/0002* (2013.01)

(58) Field of Classification Search
CPC ........... H01L 23/5227; H01L 21/3212; H01L 21/32133; H01L 27/0688; H01L 25/167; H01L 29/7395
USPC ....... 438/3; 333/185; 336/200; 257/531, 758
See application file for complete search history.

(56) References Cited

U.S. PATENT DOCUMENTS

| | | | | |
|---|---|---|---|---|
| 5,446,311 A * | 8/1995 | Ewen | .................. | H01L 23/5226 257/508 |
| 5,936,298 A * | 8/1999 | Capocelli | ............ | H01F 17/0033 257/531 |
| 8,860,544 B2 * | 10/2014 | Ko | ...................... | H01L 23/5227 336/200 |
| 2006/0250198 A1 * | 11/2006 | Meltzer | .................. | H01L 28/10 333/185 |

(Continued)

*Primary Examiner* — Amar Movva
*Assistant Examiner* — Omar Mojaddedi
(74) *Attorney, Agent, or Firm* — Nath, Goldberg & Meyer; Jerald L. Meyer

(57) ABSTRACT

The invention relates to a field of semiconductor manufacturing technology, more particularly, to a method for preparing three-dimensional integrated inductor-capacitor structure, which can realize the inductor-capacitor of three-dimensional structure, and form three-dimensional spiral inductor centering on the magnetic cores of single direction around through the preparation of the interconnected top metal conducting wires and bottom metal conducting wires, which can gain capacitance and inductance at the same time in a relatively small space, and reduce the production costs, and also greatly improves the inductance magnetic flux in order to increase the inductance value and reduce eddy current, and improve the quality factor Q value and the performance of inductance coil.

8 Claims, 6 Drawing Sheets

(56) References Cited

U.S. PATENT DOCUMENTS

2009/0101622 A1* 4/2009 Wang .................. H01L 28/60
216/13

2011/0171825 A1* 7/2011 Nejad ............... H01L 21/76802
438/637

* cited by examiner

PREPARATION METHOD OF THREE-DIMENSIONAL INTEGRATED INDUCTOR-CAPACITOR STRUCTURE

BACKGROUND OF THE INVENTION

1. Field of the Invention

The invention relates to the field of semiconductor manufacturing technology, more particularly, to a method for preparing three-dimensional integrated inductor-capacitor structure.

2. Description of the Related Art

With advances of science and technology and improvement of the degree of social information, More and more technical areas such as computer and communication are using radio frequency technology, radio frequency technology promotes rapid development of radio-frequency technique (RFIC), for the requirement of high frequency, low-power, low distortion of radio-frequency technique, inductance coil becomes necessary. The inductance coil is by the wire winding on the wire frame, wire is isolated each other, while winding can be hollow or core may be comprised, which is called inductor for short. The inductance is mainly used for segregating and filtering AC signal, or comprising a resonant circuit with capacitors and resistors.

The most important indicators to evaluating the performance of the inductance is the quality factor Q, the quality factor Q (the value of Q) represents the ratio of the stored energy and the energy dissipation per cycle in a storage device (such as inductors, capacitors, etc.), and a resonance circuit, thereby the performance indicators of integrated inductor can be increased via increasing the quality factor Q of inductance.

Most of the flat structure integrated inductors in prior art, because of the production in the parallel plane of the substrate, eddy current may form in the substrate at high frequencies, and the direction of the eddy current is opposite to the direction of the current in the inductance coil, which will inevitably lead to the decrease of magnetic flux of inductance coil, and biggish additional energy loss and make the Q value of whole inductance declined. What's more, in prior art, the integrated inductor is difficult to achieve high inductance value and high quality factor Q due to limitations of manufacture procedure and materials of integrated circuit, and the circuit configuration with both inductor and capacitor is necessary to increase the area of the device, which increases production costs to a certain extent.

The prior art to solve the problem of eddy current in the substrate by reducing the loss of the substrate, but using planar structure integrated inductors cannot increase the inductance magnetic flux in order to increase the inductance value and reduce eddy current and improve the quality factor Q value at the same time, this is because of the limitations of operating principle of the planar inductor cannot solve the problem fundamentally. Thus, inventing a high-performance integrated inductor and capacitor elements becomes a problem in the field of semiconductor manufacturing technology.

SUMMARY OF THE INVENTION

In view of the above problems, the invention provides a method for preparing a three-dimensional integrated inductor capacitor structure prepared to address the defect of high preparation cost and failure to raise the inductance magnetic flux which can increase the inductance value and reduce the eddy current and improve the quality factor Q.

The technology program used in the invention to solve the above problems is:

A method for preparing a three-dimensional integrated inductor-capacitor structure, comprising:

Step S1, providing a semiconductor substrate, and preparing a first insulating layer and an underlying metal thin film layer sequentially on said semiconductor substrate, and removing the underlying metal thin film layer partially to form several parallel arranged bottom metal conducting wires over said first insulating layer;

Step S2, preparing a second insulating layer covering an exposed surface of said bottom metal conducting wires and said first insulating layer, and etching said second insulating layer to form a first through hole on both ends which extend along the length direction of each of said bottom metal conducting wires;

Filling first metal in said first through hole to form two columns of first metal interconnections on said bottom metal conducting wires;

Step S3, preparing third insulating layer covering an upper surface of said first metal interconnections and second insulating layer, and etching the third insulating layer to form a second through hole and several annular grooves over each of said first metal interconnections, and at least two said annular grooves surrounding the each of the second through holes;

Filling second metal in said second through hole and annular grooves to form second metal interconnections and a number of annular magnetic cores on each of said first metal interconnections;

Step S4, preparing a fourth insulating layer covering upper surfaces of said second metal interconnections, said magnetic cores and said third insulating layer, and etching the fourth insulating layer to form a third through hole above each of said second metal interconnections and a fourth through hole above each of said magnetic cores;

Filling third metal in said third through hole and fourth through hole to form third metal interconnections in said third through hole and fourth metal interconnections in said fourth through hole;

Step S5, preparing a top metal thin film covering upper surfaces of said third metal interconnections, said fourth metal interconnections and fourth insulating layer; and etching said top metal thin film to form a number of leading wires and a number of top metal conducting wires arranged in parallel;

Wherein each of said leading wires are connected to said magnetic cores through said fourth metal interconnections, said top metal conducting wires connect said bottom metal conducting wires end to end in sequence through said third metal interconnections, said second metal interconnections and said first metal interconnections in turn.

Preferably, in step S5, etching said top metal thin film at a certain angle with respect to a vertical projection of said bottom metal conducting wires to form said top metal conducting wires.

Preferably, materials of said first metal and said third metal are same.

Preferably, the materials of said first metal and said third metal are tungsten or tin.

Preferably, a material of said second metal is cobalt or nickel.

Preferably, materials of said bottom metal thin film and said top metal thin film are same.

Preferably, materials of said first insulating layer, said second insulating layer, said third insulating layer and said fourth insulating layer are same.

Preferably, in the step S2~S5, chemical mechanical polishing process is required after processes of filling metal or preparing insulating layer.

Above technical scheme has the following advantages or beneficial effects:

The invention discloses a method for preparing a three-dimensional integrated inductor-capacitor structure, which can realize the inductor-capacitor of three-dimensional structure, and form three-dimensional spiral inductor centering on the magnetic cores of single direction around through the preparation of the interconnected top metal conducting wires and bottom metal conducting wires, which can gain capacitance and inductance at the same time in a relatively small space, and reduce the production costs, and also greatly improves the inductance magnetic flux in order to increase the inductance value and reduce eddy current, and improve the quality factor Q value and the performance of inductance coil.

BRIEF DESCRIPTIONS OF THE DRAWINGS

By reading reference to the following detailed descriptions of the drawings to non-limiting embodiment, the invention and its features, shapes and advantages will become more apparent. The same numerals indicate the same parts throughout the drawings. The drawings have not drawn to scale, the emphasis is showing the spirit of the invention.

DETAILED DESCRIPTIONS

Figure 1:
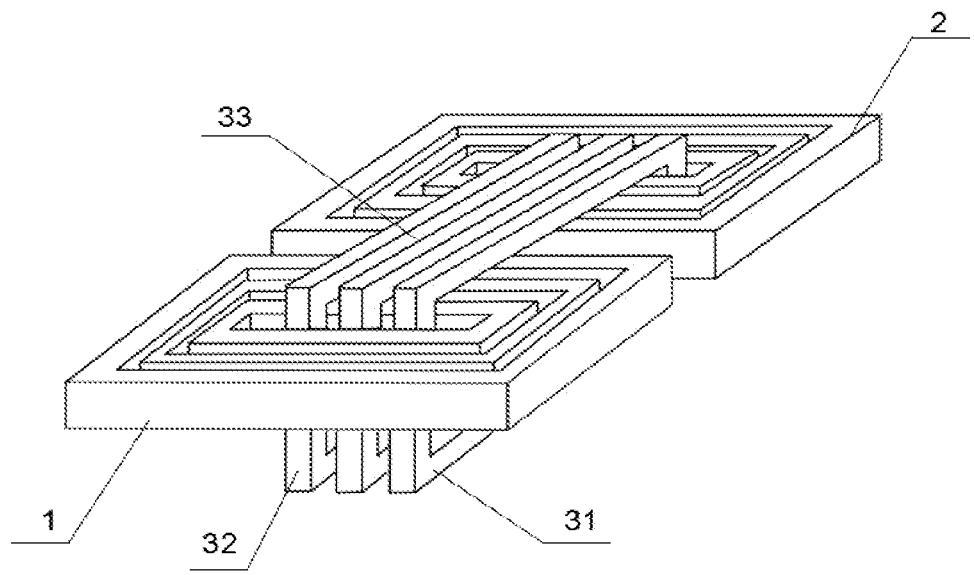
FIG. 1 is a structure schematic of a three-dimensional integrated inductor capacitor in the present invention.

The following is the further description of the invention by combining the drawing and the embodiments, and it cannot be the limitation for the invention.

In order to reduce the eddy current while increasing the inductance magnetic flux to increase inductance value, and to improve the quality factor Q and the performance of the inductance coil, we need to prepare a three-dimensional integrated inductor capacitor structure.

As shown in FIG. 1, the three-dimensional integrated inductor capacitor structure comprises a first capacitor and a second capacitor, the first capacitor and second capacitor are both formed by several metal frames 1, the cross-sectional area of which increases gradually, nesting each other in the same plane, and the metal frames are electrically connected to each other to form the capacitor plates (not shown in FIG. 1).

Preferably, the first capacitor and the second capacitor do not contact each other in the same plane, and insulating medium 5 is filed between the first capacitor plates and second capacitor plates are filled. The design can improve the performance of capacitance in a smaller space.

Figure 2:
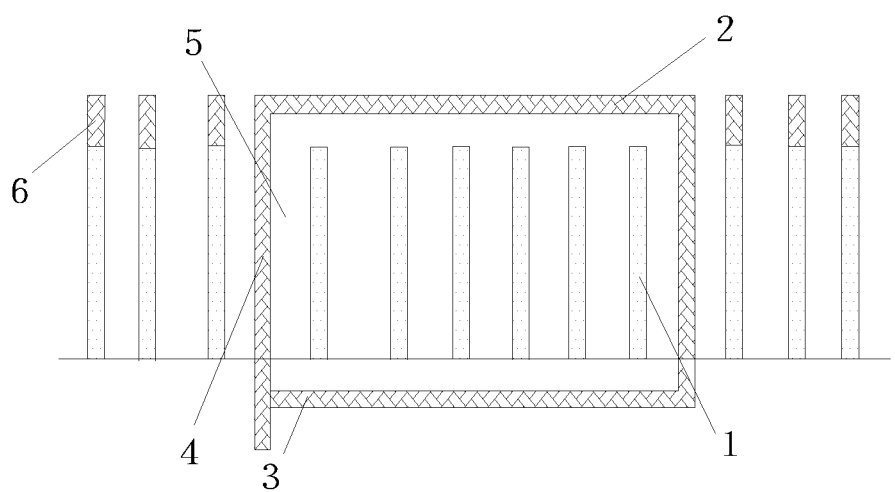
FIG. 2 is a structure schematic of a side section of the three-dimensional integrated inductor capacitor in the present invention.

Furthermore, the structure includes an inductance coil, shown in FIG. 1, specifically including a number of first metallic wires 2 and second metallic wires 3 which are uniformly and parallel distributed, the first metallic wires 2 and the second metallic wires 3 are located on both sides of the plane where the metal frames 1 locate, and the projection of the head ends of the first metallic wires 2 and the second metallic wires 3 (also comprises the tail ends of the first metallic wires 2 and the second metallic wires 3) are overlapped and are all perpendicular to the metal frame 1 of the capacitor. Preferably, the plane of the first metallic wires 2, the plane of the second metallic wires 3 and the plane of the metal frame 1 are parallel to each other. Wherein, the inductance coil further comprises a third metallic wire 4, the metallic wire 4 vertically passes through the area of the metal frame 1 whose cross-sectional area is the smallest, so that it can achieve the following effects:

The head end of the first metallic wire 2 connects to the head end of the second metallic wire 3 which overlaps the projection of the first end of the first metallic wire 2 in vertical direction thought the third metallic wire 4, and the tail end of the second metallic wire 3 which overlaps the projection of the head end of the first metallic wire 2 connects to the tail end of another first metallic wire 2 which is adjacent to the first metallic wire 2 thought another third metallic wire 4, so that to form single direction circuitous and three-dimensional spiral inductance coil (with metal frame as core), moreover the metal frame 1 may be electrically connected through metal leads 6 to form capacitor plate, as shown in FIG. 2.

Figure 3A:
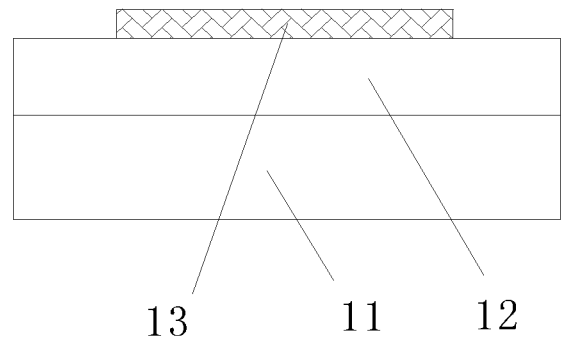
FIGS. 3a-7b are flow charts of the preparation processes of three-dimensional integrated inductor capacitor structure in the present invention.
Figure 3B:
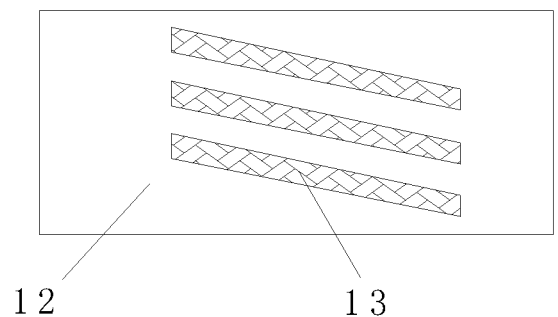

Based on the above structure, the invention provides a method for preparing a three-dimensional integrated inductor-capacitor structure:

Step S1, processing a semiconductor substrate, specifically preparing a first insulating layer 12 (after the deposition of insulating layer thermal annealing process should be carried out quickly to form a dense insulating layer) and a underlying metal thin film layer sequentially on said semiconductor substrate 11, and partially removing the underlying metal thin film layer to form a number of bottom metal conducting wires 13 over said first insulating layer 12, wherein all the bottom metal conducting wires 13 are arranged in parallel on the surface of the first insulating layer 12, as shown in FIGS. 3a and 3b.

In an embodiment of the invention, the material of the above-mentioned underlying metal thin film layer is aluminum, and the bottom metal conducting wires 13 serve as the second metal wire 3 of the above-mentioned inductance coil.

Step S2, continue to deposit a second insulating layer 14 on the upper surface of the number of parallel arranged bottom metal conducting wires 13 and the exposed upper surface of first insulating layer 12 using plasma chemical vapor deposition processes, and then etching the second insulating layer 14 using the processes, such as Inductively Coupled Plasma or Reactive Ion Etching, to form a first through hole on both ends which extend along the length direction of each of the bottom metal conducting wire.

Figure 4A:
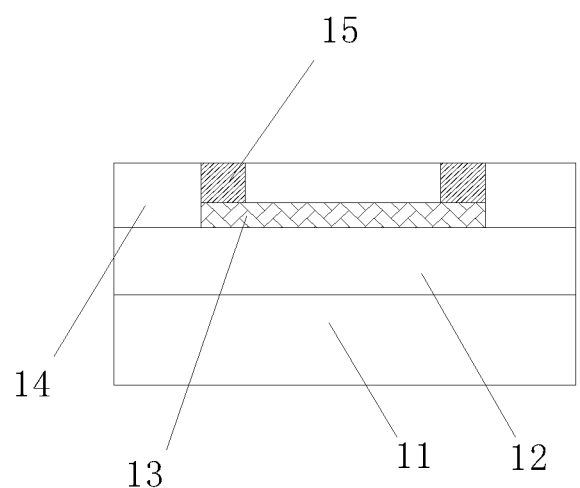
Figure 4B:
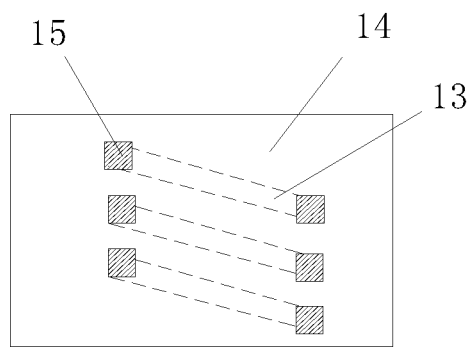

In an embodiment of the present invention, the first through hole is filled with a first metal, and two rows of the first metal interconnections 15 are formed at the bottom metal conducting wires 13, as shown in FIGS. 4a and 4b.

In an embodiment of the invention, preferably, the material of the first metal is tungsten or tin.

Meanwhile, in order to optimize the preparation technology of three-dimensional integrated inductance, chemical mechanical polishing should be carried out after the deposition of second insulating layer 14 and the filling of first metal in first through-hole.

Preferably, the material of the second insulating layer 14 is the same as that of the first insulating layer 12, silica will be an option.

Step S3, continue to deposit third insulating layer 16 over the upper surface of the second insulating layer 14 and the first metal interconnections 15 by plasma chemical vapor deposition, preferably, the material of the third insulating layer 16 is the same as that of the second insulating layer 14. And then a portion of the third insulating layer 16 is etched by ICP or RIE to form a second through hole which exposes the upper surface of each of the first metal interconnections 15 and to form a plurality of annular grooves surrounding the second through hole.

In an embodiment of the invention, preferably, the number of the annular grooves is at least 2, e.g., 3.

Figure 5A:
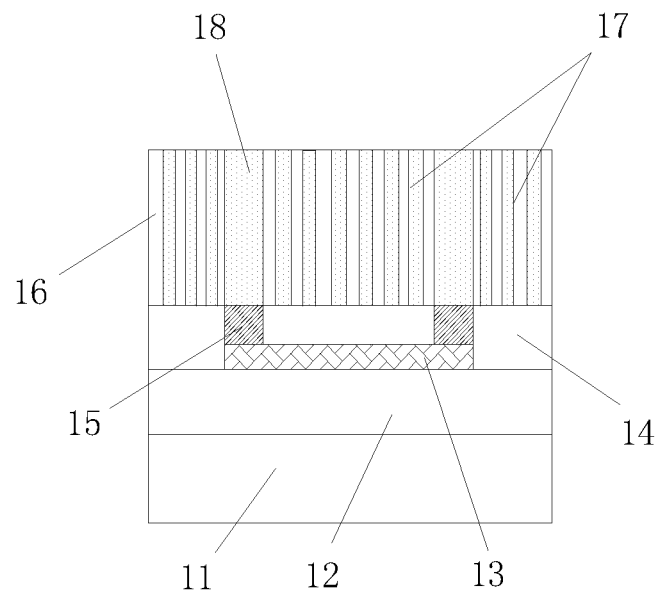
Figure 5B:
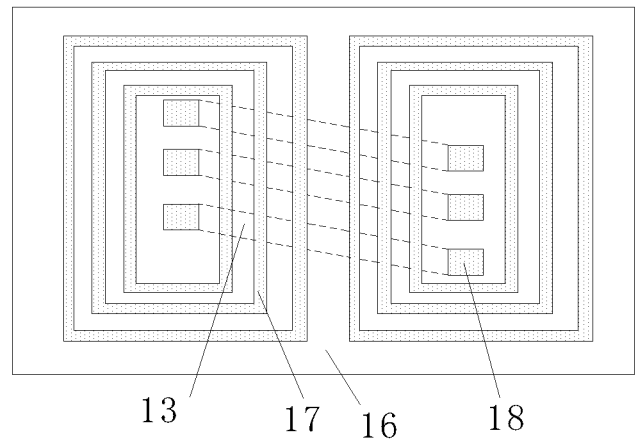

In order to improve the performance of three-dimensional integrated inductance capacitor, the embodiment of the invention is required to provide core to enhance the storage effect of magnetic energy, so after the completion of the technology of annular grooves and the second through hole, second metal (such as cobalt, nickel, etc.) is filled in annular grooves and second through hole to form a second metal interconnection 18 and a number of magnetic cores 17 on top of each of the first metal interconnections, as shown in FIGS. 5a and 5b.

Wherein, the a number of magnetic cores 17 mentioned above constitute the above-mentioned metal frame 1 (or the first capacitor and the second capacitor).

In an embodiment of the invention, in order to optimize the preparation technology of three-dimensional integrated inductors, it is necessary to carry out CMP technology after the deposition of third insulating layer 16 and the filling of second metal into the second through hole and the annular grooves.

Step S4, continue to deposit fourth insulating layer 19 over the upper surface of third insulating layer 16, second metal interconnections 18 and magnetic cores 17 by plasma chemical vapor deposition, and then etch the fourth insulating layer 19 by ICP or RIE to form a third through hole above each of the second metal interconnections 18 to expose the second metal interconnections 18, and to form a fourth through hole above each of the magnetic cores 17.

Continue filling third metal in the third through holes and fourth through holes, to form third metal interconnections 20 in the third through holes, and fourth metal interconnections 201 in the fourth through hole.

Figure 6A:
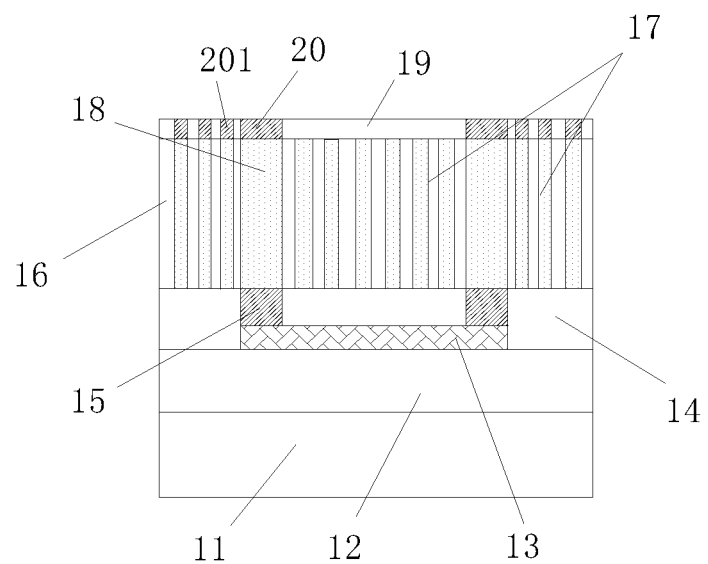
Figure 6B:
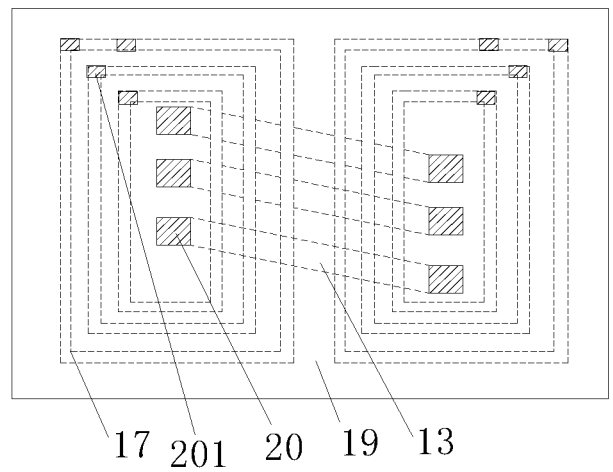

In an embodiment of the invention, preferably, the material of third metal is the same as that of the first metal, which is tungsten or tin, as shown in FIGS. 6a and 6b.

Similarly, it is necessary to carry out CMP technology after the deposition of fourth insulating layer 19 and the filling of metal in order to optimize the preparation technology of three-dimensional integrated inductor capacitor structure.

Preferably, the materials of first insulating layer 12, second insulating layer 14, third insulating layer 16 and fourth insulating layer 19 are same, and more preferably are all silicon dioxide.

Figure 7A:
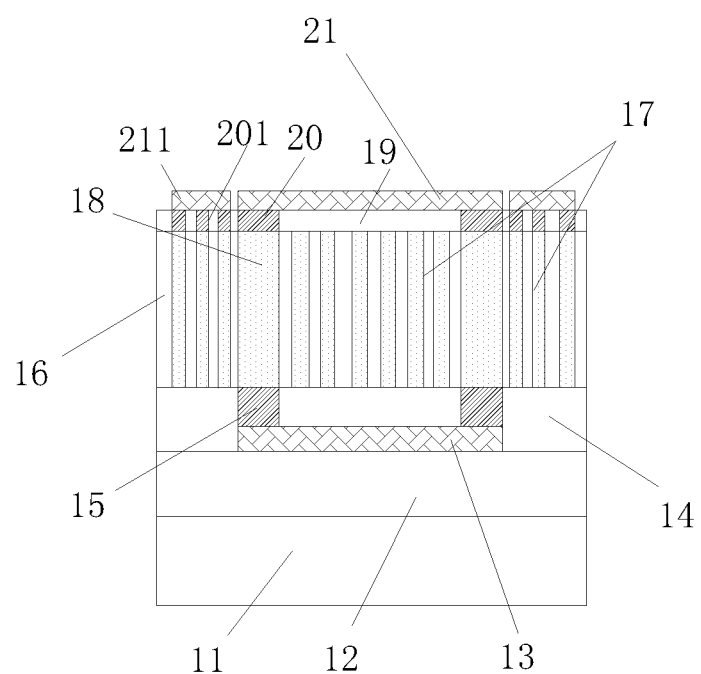
Figure 7B:
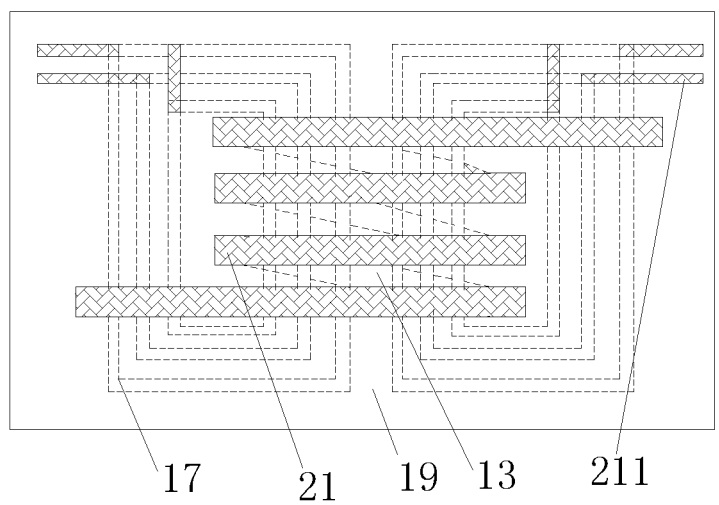

Step S5, continue to deposit a top metal thin film over the upper surface of third metal interconnections 20, fourth metal interconnections 201 and fourth insulating layer 19, and etch the top metal thin film to form a number of parallel arranged top metal conducting wires 21 and a leading wire 211 over each of fourth metal interconnections 201, as shown in FIGS. 7a and 7b.

In an embodiment of the invention, etch the top metal thin film to form the above-mentioned top metal conducting wires 21 at a certain angle in the direction of perpendicular projection to the bottom metal conducting wires 13, that is, the bottom metal conducting wires 13 and the top metal conducting wires 21 form a certain angle in vertical projection direction, to facilitate subsequent forming spiral inductance coil, the top metal conducting wires 21 serve as first metal wire 2 of the above-mentioned inductance coil.

Wherein, each of the leading wires 211 are connected to the magnetic cores 17 through fourth metal interconnections 201 to form the above-mentioned capacitor plate; each of the first metal interconnections 15, second metal interconnections 18 and third metal interconnections 20 constitute the above-mentioned third metal wire 4, and each of the top metal conducting wires 21 connect the bottom metal conducting wires 13 end to end in sequence through the third metal interconnections 20, the second metal interconnections 18 and the first metal interconnections 15 in turn to form the above-mentioned spiral inductance coil finally.

In summary, the invention discloses a method for preparing a three-dimensional integrated inductor-capacitor structure, which can realize the inductor-capacitor of three-dimensional structure, and form three-dimensional spiral inductor centering on the magnetic cores of single direction around through the preparation of the interconnected top metal conducting wires and bottom metal conducting wires, which can gain capacitance and inductance at the same time in a relatively small space, and reduce the production costs, and also greatly improves the inductance magnetic flux in order to increase the inductance value and reduce eddy current, and improve the quality factor Q value and the performance of inductance coil.

Those skilled in the art should be understood that those skilled in the art may implement the modified examples combining with the above-described embodiments, not repeat here. Examples of such changes do not affect the substance of the invention, not repeat here.

More than better implementation examples of the invention are described. To be understood that the invention is not limited to the specific embodiment in which the device and structure not described in detail should be understood be carried out in the normal way; anyone technical personnel familiar with the field may use the above-mentioned method and technical content to make many possible changes and modification, or change to the equivalent implementation under the condition of not out of the scope of the technical scheme of the invention, and this does not affect the substance of the invention. Therefore, any content without departing from the technical scheme of the invention, any simple modification, equivalent change and modify to the above examples based on the technology of the invention, are still belongs to the scope of the invention.

What is claimed is:

1. A method for preparing a three-dimensional integrated inductor-capacitor structure, comprising:

Step S1, providing a semiconductor substrate, and preparing a first insulating layer and an underlying metal thin film layer sequentially on said semiconductor substrate, and removing the underlying metal thin film layer partially to form several parallel arranged bottom metal conducting wires over said first insulating layer;

Step S2, preparing a second insulating layer covering an exposed surface of said bottom metal conducting wires and said first insulating layer, and etching said second insulating layer to form a first through hole on both ends which extend along the length direction of each of said bottom metal conducting wires;

filling a first metal in said first through hole to form two columns of first metal interconnections on said bottom metal conducting wires;

Step S3, preparing third insulating layer covering an upper surface of said first metal interconnections and second insulating layer, and etching the third insulating layer to form a second through hole and at least two annular grooves over each said first metal interconnections, and at least two said annular grooves surrounding each said second through holes;

filling a second metal in said second through hole and annular grooves to form second metal interconnections and at least two annular magnetic cores on each said first metal interconnections;

Step S4, preparing a fourth insulating layer covering upper surfaces of said second metal interconnections, said magnetic cores and said third insulating layer, and etching the fourth insulating layer to form a third through hole above each said second metal interconnections and a fourth through hole above each said magnetic cores;

filling a third metal in said third through hole and fourth through hole to form third metal interconnections in said third through hole and fourth metal interconnections in said fourth through hole;

Step S5, preparing a top metal thin film covering upper surfaces of said third metal interconnections, said fourth metal interconnections and fourth insulating layer; and etching said top metal thin film to form at least two leading wires and at least two top metal conducting wires arranged in parallel;

wherein each said leading wires are connected to said magnetic cores through said fourth metal interconnections, said top metal conducting wires connect said bottom metal conducting wires end to end in sequence through said third metal interconnections, said second metal interconnections and said first metal interconnections in turn.

2. The method for preparing the three-dimensional integrated inductor capacitor structure as claimed in claim 1, wherein in step S5, etching said top metal thin film at an acute angle with respect to a vertical projection of said bottom metal conducting wires to form said top metal conducting wires.

3. The method for preparing the three-dimensional integrated inductor capacitor structure as claimed in claim 1, wherein materials of said first metal and said third metal are the same.

4. The method for preparing the three-dimensional integrated inductor capacitor structure as claimed in claim 3, wherein the materials of said first metal and said third metal are tungsten or tin.

5. The method for preparing the three-dimensional integrated inductor capacitor structure as claimed in claim 1, wherein a material of said second metal is cobalt or nickel.

6. The method for preparing the three-dimensional integrated inductor capacitor structure as claimed in claim 1, wherein materials of said bottom metal thin film and said top metal thin film are the same.

7. The method for preparing the three-dimensional integrated inductor capacitor structure as claimed in claim 1, wherein materials of said first insulating layer, said second insulating layer, said third insulating layer and said fourth insulating layer are the same.

8. The method for preparing the three-dimensional integrated inductor capacitor structure as claimed in claim 1, wherein, in the step S2~S5, chemical mechanical polishing process is required after processes of filling metal or preparing insulating layer.

\* \* \* \* \*